United States Patent
Kwon et al.

(10) Patent No.: US 9,806,262 B2
(45) Date of Patent: Oct. 31, 2017

(54) METHOD OF MANUFACTURING ORGANIC LIGHT EMITTING DEVICE

(71) Applicant: ELECTRONICS AND TELECOMMUNICATIONS RESEARCH INSTITUTE, Daejeon (KR)

(72) Inventors: Byoung-Hwa Kwon, Daejeon (KR); Jeong Ik Lee, Daejeon (KR); Hyunkoo Lee, Daejeon (KR); Jong Tae Lim, Seoul (KR); Byoung Gon Yu, Yeongdong-gun (KR); Jonghee Lee, Daejeon (KR); Doo-Hee Cho, Daejeon (KR); Hyunsu Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/202,025

(22) Filed: Jul. 5, 2016

(65) Prior Publication Data
US 2017/0133596 A1    May 11, 2017

(30) Foreign Application Priority Data
Nov. 10, 2015 (KR) .................. 10-2015-0157621

(51) Int. Cl.
*H01L 51/52* (2006.01)
*H01L 51/54* (2006.01)
(Continued)

(52) U.S. Cl.
CPC ........ *H01L 51/0024* (2013.01); *G02B 5/0242* (2013.01); *H01L 51/0021* (2013.01);
(Continued)

(58) Field of Classification Search
CPC ............ H01L 51/5275; H01L 51/0024; H01L 2251/5369
See application file for complete search history.

(56) References Cited

U.S. PATENT DOCUMENTS 7,851,995 B2 * 12/2010 Tyan ................. C03C 17/38
313/498
8,368,064 B2    2/2013 Wada et al.
(Continued)

FOREIGN PATENT DOCUMENTS

JP       5531967 B2     6/2014
KR    10-1114917 B1     2/2012
(Continued)

OTHER PUBLICATIONS

Lu Li et al., "A Solution Processed Flexible Nanocomposite Electrode with Efficient Light Extraction for Organic Light Emitting Diodes", Scientific Reports, Mar. 17, 2014, pp. 1-8, vol. 6, No. 15.

*Primary Examiner* — Victor A Mandala
*Assistant Examiner* — Regan J Rundio

(57) ABSTRACT

Provided is a method of manufacturing an organic light emitting device, the method including forming a lower electrode on a lower substrate, forming an organic layer on the lower electrode, forming a light extraction layer including an adhesion layer and nanoparticles on an upper substrate, forming an upper electrode on the light extraction layer, and coupling the lower substrate to the upper substrate so that the upper electrode contacts the organic layer. The forming of the light extraction layer includes providing an adhesive between a first sacrificial substrate and the upper substrate, curing the adhesive to form the adhesion layer to form the adhesion layer, and removing the first sacrificial substrate to expose the adhesion layer. The first sacrificial substrate and the upper substrate are coupled to each other by the adhesion layer.

18 Claims, 9 Drawing Sheets

(51) Int. Cl.
*H01L 51/56* (2006.01)
*G02B 5/02* (2006.01)
*H01L 51/00* (2006.01)

(52) U.S. Cl.
CPC ...... *H01L 51/5234* (2013.01); *H01L 51/5268* (2013.01); *H01L 51/56* (2013.01); *H01L 2251/303* (2013.01); *H01L 2251/5315* (2013.01); *H01L 2251/5369* (2013.01)

(56) References Cited

U.S. PATENT DOCUMENTS

| | | | |
|---|---|---|---|
| 2009/0052195 A1* | 2/2009 | Saneto | G02B 5/0278 362/355 |
| 2011/0298361 A1* | 12/2011 | Matsunaga | G02B 5/0242 313/504 |
| 2013/0032840 A1 | 2/2013 | Cho et al. | |
| 2013/0284354 A1* | 10/2013 | Lee | H01L 51/0096 156/247 |
| 2013/0286659 A1* | 10/2013 | Lee | H01L 51/0096 362/326 |
| 2014/0145160 A1 | 5/2014 | Cho et al. | |

FOREIGN PATENT DOCUMENTS

| KR | 10-2014-0074446 A | 6/2014 |
|---|---|---|
| KR | 10-2014-0115507 A | 10/2014 |
| KR | 10-2016-0065294 A | 6/2016 |

\* cited by examiner

METHOD OF MANUFACTURING ORGANIC LIGHT EMITTING DEVICE

CROSS-REFERENCE TO RELATED APPLICATIONS

This U.S. non-provisional patent application claims priority under 35 U.S.C. §119 of Korean Patent Application No. 10-2015-0157621, filed on Nov. 10, 2015, the entire contents of which are hereby incorporated by reference.

BACKGROUND

The present disclosure herein relates to a method of manufacturing an organic light emitting device, and more particularly, to a method of manufacturing an organic light emitting device including a light extraction layer.

An organic light emitting device refers to a device in which a hole provided from an anode electrode and an electron provided from a cathode electrode are coupled in an organic light emitting layer formed between the both electrodes to form an exciton. The exciton is radiatively-recombined to emit light. Since the organic light emitting device is generally fabricated by physically laminating various components such as a substrate, an organic layer, and a thin film electrode, interfaces between layers may have different reflective indexes, respectively. When light emitted from the interface of each of the layers has an incident angle that is greater than a critical angle, the light may not be released to the outside and isolated therein. Eventually, only about 20% of the generated light is released to the outside, and most of the light is dissipated due to a wave-guiding effect caused by a difference between reflective indexes of a glass substrate, a transparent electrode, and an organic layer and a total reflection effect caused by a difference between reflective indexes of the glass substrate and the air.

In general, the organic light emitting device has a bottom emission structure in which a transparent substrate such as glass and a transparent electrode are applied as a lower electrode. However, in case of the bottom emission structure, since an opening ratio decreases due to an area occupied by a driving thin film transistor (TFT), a substantial emission area per unit pixel decreases as luminance decreases and resolution increases. Accordingly, a driving voltage increases to realize the same level of luminance, thereby reducing a reliability of the device and increasing a consumption of electric power. Thus, as a resolution of a display device has increased in recent years, demand for a top emission structure using a transparent upper electrode is increasing.

SUMMARY

The present disclosure provides a method of manufacturing an organic light emitting device including a light extraction layer.

The present disclosure also provides a method of manufacturing an organic light emitting device including an upper electrode having a high transmittance and a low resistance.

The object of the present disclosure is not limited to the aforesaid, but other objects not described herein will be clearly understood by those skilled in the art from descriptions below.

An embodiment of the inventive concept provides a method of manufacturing an organic light emitting device, the method including: forming a lower electrode on a lower substrate; forming an organic layer on the lower electrode; forming a light extraction layer including an adhesion layer and nanoparticles on an upper substrate; forming an upper electrode on the light extraction layer; and coupling the lower substrate to the upper substrate so that the upper electrode contacts the organic layer.

In an embodiment, the forming of the light extraction layer may include: providing an adhesive between a first sacrificial substrate and the upper substrate; curing the adhesive to form the adhesion layer to form the adhesion layer; and removing the first sacrificial substrate to expose the adhesion layer.

In an embodiment, the first sacrificial substrate and the upper substrate may be coupled to each other by the adhesion layer.

In an embodiment, the adhesive may include the nanoparticles, and the nanoparticles may be added at about 0.1 wt % to about 50 wt % on the basis of a weight of the adhesive.

In an embodiment, the method may further include forming a binder on the supper substrate before the adhesive is provided between the first sacrificial substrate and the upper substrate. The adhesion layer may cover the binder.

In an embodiment, the binder may include the nanoparticles, and the nanoparticles may be added at about 0.1 wt % to about 50 wt % on the basis of a weight of the binder.

In an embodiment, the binder may include acrylate or urethane.

In an embodiment, the adhesive may include a polydimethylsiloxane having an acrylate terminal functional group, an epoxy terminal functional group, or a carbinol terminal functional group.

In an embodiment, each of the nanoparticles may include a titanium oxide (TiO2) or a zirconium oxide (ZrO).

In an embodiment, each of the nanoparticles may have a diameter of about 10 nm to about 600 nm.

In an embodiment, each of the nanoparticles may have a reflective index of about 1.7 to about 3.0.

In an embodiment, the forming of the upper electrode may include:
forming a catalyst layer on a second sacrificial substrate; forming a preliminary upper electrode on the catalyst layer; and transferring the preliminary upper electrode onto the light extraction layer.

In an embodiment, the method may further include forming a self-assembled monolayer (SAM) on the first sacrificial substrate before the adhesive is provided between the first sacrificial substrate and the upper substrate.

In an embodiment, the self-assembled monolayer may have a center line average roughness (Ra) that is equal to or less than about 1 nm.

In an embodiment, the self-assembled monolayer may include trichloro-alkylsilane.

In an embodiment, an interface between the light extraction layer and the upper electrode may have a center line average roughness (Ra) that is equal to or less than about 1 nm.

In an embodiment of the inventive concept, a method of manufacturing an organic light emitting device includes: forming a lower electrode on a lower substrate; forming an organic layer on the lower electrode; forming an upper substrate including nanoparticles; forming an adhesion layer on the upper substrate; forming an upper electrode on the adhesion layer; and coupling the lower substrate to the upper substrate so that the upper electrode contacts the organic layer.

In an embodiment, the forming of the adhesion layer may include: providing an adhesive between a first sacrificial substrate and the upper substrate; curing the adhesive; and removing the first sacrificial substrate to expose the cured adhesive.

In an embodiment, the forming of the upper substrate may include: applying a precursor solution on a third sacrificial substrate; curing the precursor solution; and removing the third sacrificial substrate to form the upper substrate.

In an embodiment, the precursor solution may include the nanoparticles.

In an embodiment, the precursor solution may include poly(amic acid).

In an embodiment, each of the nanoparticles may include a titanium oxide ($TiO_2$) or a zirconium oxide (ZrO).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
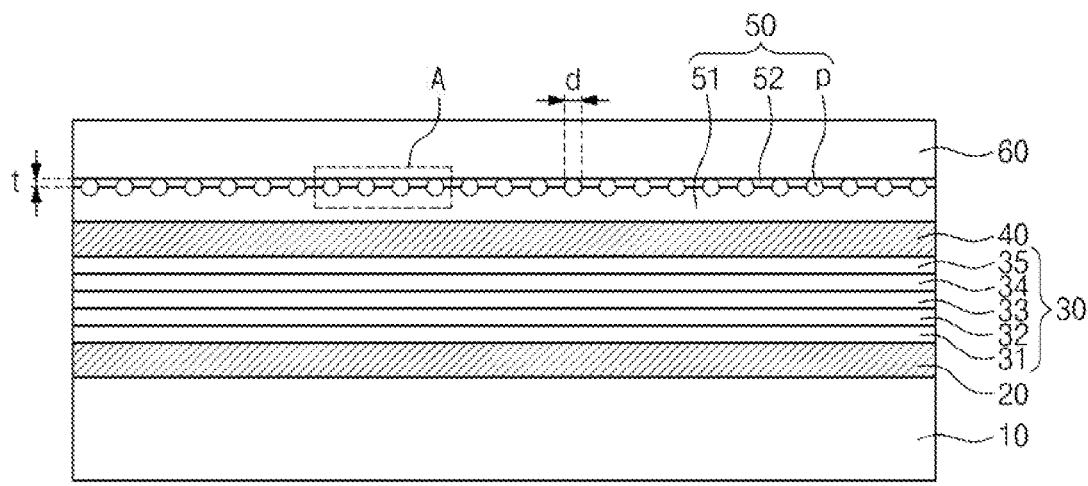
FIG. 1 is a cross-sectional view for explaining an example of an organic light emitting device according to embodiments of the inventive concept.

Exemplary embodiments of the present invention will be described with reference to the accompanying drawings so as to sufficiently understand constitutions and effects of the present disclosure. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. A person with ordinary skill in the technical field of the present disclosure pertains will be understood that the present disclosure can be carried out under any appropriate environments. Like reference numerals refer to like elements throughout.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present disclosure, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Additionally, the embodiment in the detailed description will be described with sectional views and/or plan views as ideal exemplary views of the present disclosure. In the figures, the dimensions of layers and regions are exaggerated for clarity of illustration. Accordingly, shapes of the exemplary views may be modified according to manufacturing techniques and/or allowable errors. Therefore, the embodiments of the present disclosure are not limited to the specific shape illustrated in the exemplary views, but may include other shapes that may be created according to manufacturing processes. For example, an etched region having a right angle illustrated in the drawings may have a round shape or a shape having a predetermined curvature. Areas exemplified in the drawings have general properties, and are used to illustrate a specific shape of a semiconductor package region. Thus, this should not be construed as limited to the scope of the present disclosure.

Unless terms used in embodiments of the present disclosure are differently defined, the terms may be construed as meanings that are commonly known to a person skilled in the art.

Hereinafter, the present disclosure will be described in detail by explaining preferred embodiments of the disclosure with reference to the attached drawings.

Figure 2:
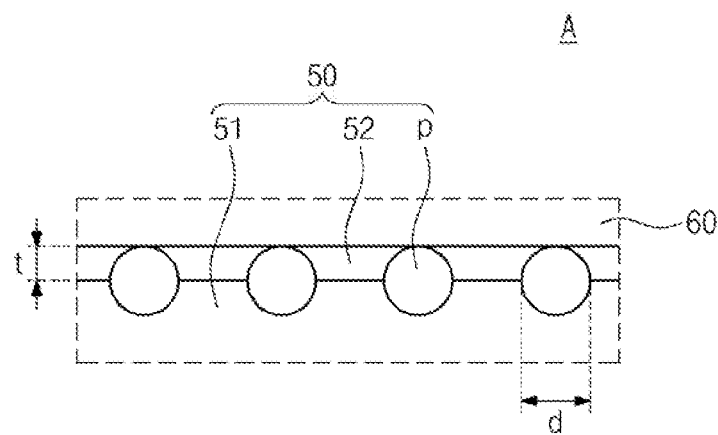
FIG. 2 is an enlarged view of a region A of FIG. 1.

FIG. 1 is a cross-sectional view for explaining an example of an organic light emitting device according to embodiments of the inventive concept. FIG. 2 is an enlarged view of a region A of FIG. 1.

Referring to FIG. 1, a lower substrate 10 may be provided. The lower substrate 10 may include a transparent substrate such as glass.

A lower electrode 20 may be disposed on the lower substrate 10. The lower electrode 20 may include an indium tin oxide (ITO), aluminum (Al), or graphene.

An organic layer 30 may be disposed on the lower electrode 20. The organic layer 30 may include a first charge injecting layer 31, a first charge transporting layer 32, an organic light emitting layer 33, a second charge transporting layer 34, and a second charge injecting layer 35.

The first charge injecting layer 31 may be disposed on the lower electrode 20. The first charge injecting layer 31 may be one of an electron injecting layer and a hole injecting layer. For example, the electron injecting layer may include a metal oxide film or metal carbide film including lithium, zinc, calcium, potassium, or cesium. For example, the hole injecting layer may include CuPc or m-MTDATA.

The first charge transporting layer 32 may be disposed on the first charge injecting layer 31. The first charge transporting layer 32 may be one of an electron transporting layer and a hole transporting layer. For example, the electron transporting layer may include Alq3, TAZ, or LiF. For example, the hole transporting layer may include αNPD, TPD, or Teflon-AF.

The organic light emitting layer 33 may be disposed on the first charge transporting layer 32. The organic light emitting layer 33 may include a monomolecule and a polymer. The organic light emitting layer 33 may emit light through re-coupling between the electrons and the holes, which are respectively provided from the lower electrode 20 and the upper electrode 40. The light emitted from the organic light emitting layer 33 may have a color that varies on the basis of a composition ratio of a host and a dopant in an organic material of the organic light emitting layer 33.

The second charge transporting layer 34 may be disposed on the organic light emitting layer 33. The second charge transporting layer 34 may be one of the electron transporting layer and the hole transporting layer. For example, the hole transporting layer may include αNPD, TPD, or Teflon-AF. For example, the electron transporting layer may include Alq3, TAZ, or LiF.

The second charge injecting layer 35 may be disposed on the second charge transporting layer 34. The second charge injecting layer 35 may be one of the electron injecting layer and the hole injecting layer. For example, the hole injecting layer may include CuPc or m-MTDATA. For example, the electron injecting layer may include the metal oxide film or metal carbide film including lithium, zinc, calcium, potassium, or cesium.

According to an embodiment, although the organic layer 30 includes the first charge injecting layer 31, the first charge transporting layer 32, the organic light emitting layer 33, the second charge transporting layer 34, and the second charge injecting layer 35, which are sequentially laminated, embodiments of the inventive concept are not limited thereto. According to another embodiment, one of the first charge injecting layer 31, the first charge transporting layer 32, the second charge transporting layer 34, and the second charge injecting layer 35 may be omitted.

The upper electrode 40 may be disposed on the organic layer 30. For example, the upper electrode 40 may include graphene, a carbon nano tube (CNT), an Ag nano wire, or PEDOT:PSS. The upper electrode 40 may have a surface roughness that is equal to or less than about 1 nm. Here, the surface roughness may be defined as a center line average roughness (Ra). Hereinafter, all of the surface roughness refer to the center line average roughness (Ra). The upper electrode 40 having the surface roughness that is equal to or less than about 1 nm may decrease a reflectance of the organic light emitting device and increase a transmittance thereof. Also, the upper electrode 40 having the surface roughness that is equal to or less than about 1 nm may reduce surface resistance characteristics of the organic light emitting device.

The light extraction layer 50 may be disposed on the upper electrode 40. The light extraction layer 50 may include an adhesion layer 51, a binder layer 52, and nanoparticles p. Hereinafter, a constitution of the light extraction layer 50 will be explained with reference to FIGS. 1 and 2.

Referring to FIGS. 1 and 2, the adhesion layer 51 may be disposed on the upper electrode 40. The adhesion layer 51 may directly contact the upper electrode 40. The adhesion layer 51 may be a semisolid having viscoelasticity and deformed by an external force. The adhesion layer 51 may include poly dimethyl siloxanes having a plurality of different kinds of terminal functional groups. For example, the adhesion layer 51 may include the poly dimethyl siloxanes having an acrylate terminal functional group, an epoxy terminal functional group, or a carbinol terminal functional group. A contact surface between the adhesion layer 51 and the upper electrode 40 may have the center line average roughness (Ra) that is equal to or less than about 1 nm.

The binder layer 52 may be disposed on the adhesion layer 51. The binder layer 52 may include an organic binder. For example, the organic binder may include acrylate or urethane. The binder layer 52 may have a thickness t that is less than a diameter d of each of nanoparticles p that will be described later. For example, the binder layer 52 may have the thickness t that is less than about 600 nm. Although the thickness t of the binder layer 52 is less than the diameter d of each of the nanoparticles p that will be described later in FIGS. 1 and 2, an embodiment of the inventive concept is not limited thereto. According to another embodiment, the binder layer 52 may have the thickness t that is greater than the diameter d of each of nanoparticles p.

The nanoparticles p may be disposed on an interface between the binder layer 52 and the adhesion layer 51. That is, one portion of the nanoparticles p may be disposed in the binder layer 52, and the other portion of the nanoparticles p may be disposed in the adhesion layer 51 with the interface between the binder layer 52 and the adhesion layer therebetween. Here, the plurality of nanoparticles p may be spaced apart from each other to be parallel to the interface between the binder layer 52 and the adhesion layer 51. Although an arrangement structure of the nanoparticles p is not especially limited, the arrangement structure may be formed in a single layer to obtain a uniform scattering effect. For example, the plurality of nanoparticles p may be spaced apart from each other to be parallel to the interface between the binder layer 52 and the adhesion layer 51. The reason is to obtain the uniform scattering effect. On the other hand, when the thickness t of the nanoparticles p is greater than the diameter d, the nanoparticles p may be arranged to be dispersed in the binder layer 52. Each of the nanoparticles p may be formed in a size capable of obtaining a light scattering effect. For example, each of the nanoparticles p may have the diameter d of about 10 nm to about 600 nm. When each of the nanoparticles p has the diameter d that is less than about 10 nm, the light scattering effect may not be sufficiently obtained. When each of the nanoparticles p has the diameter d that is greater than about 600 nm, a thickness of the light extraction layer 50 may become thick. Although each of the nanoparticles p has a globular shape, it may have an oval or amorphous shape. Each of the nanoparticles p may include a material having a high refractive index and desirably have the refractive index of about 1.7 to about 3. For example, the each of the nanoparticles p may include a titanium oxide ($TiO_2$) or a zirconium oxide (ZrO). The nanoparticles p may scatter the light emitted from the organic layer 30 to increase a light extraction efficiency of the organic light emitting device.

The upper substrate 60 may be disposed on the light extraction layer 50. The upper substrate 60 may include a polyethylene terephthalate (PET) film, a poly ethylene naphthalate (PEN) film, or polyimide (PI) film. The upper substrate 60 may be a display substrate to which the light emitted from the organic layer 30 is released.

Although not shown, a thin film transistor (TFT) may be disposed between the lower substrate 10 and the lower electrode 20. The thin film transistor (not shown) may be electrically connected to the organic layer 30 through the lower electrode 20. The thin film transistor (not shown) may control a turn-on signal of the organic layer 30. That is, the thin film transistor (not shown) may receive an electric signal to allow the organic layer 30 to emit light.

Figure 3:
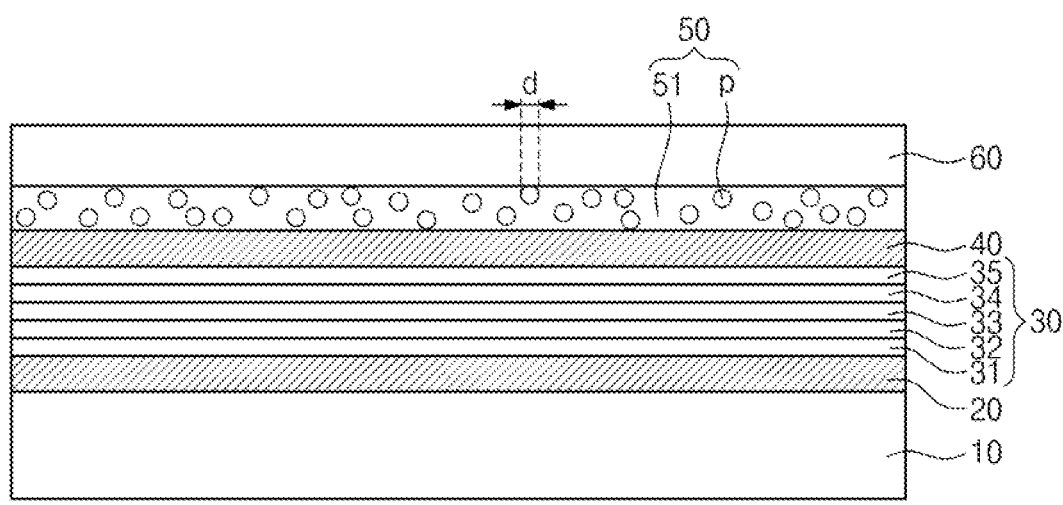
FIG. 3 is a cross-sectional view for explaining a modified example of a light extraction layer.

FIG. 3 is a cross-sectional view for explaining a modified example of the light extraction layer. For simplicity of explanation, description for duplicated constitutions may be omitted.

According to an embodiment, the light extraction layer 50 may not include the above-described binder layer 52. The light extraction layer 50 may include the adhesion layer 51 and the nanoparticles p provided in the adhesion layer 51.

The adhesion layer 51 may be disposed on the upper electrode 40. The adhesion layer 51 may be a semisolid having viscoelasticity and deformed by an external force. The adhesion layer 51 may include poly dimethyl siloxanes having a plurality of different kinds of terminal functional groups. For example, the adhesion layer 51 may include poly dimethyl siloxanes having an acrylate terminal functional group, an epoxy terminal functional group, or a carbinol terminal functional group.

The nanoparticles p may be disposed in the adhesion layer 51. Here, the nanoparticles p may be provided in plurality and arrangement of the nanoparticles p may have irregularity. Each of the nanoparticles p may have the diameter d of about 10 nm to about 600 nm. Each of the nanoparticles p may include a material having a high refractive index and desirably have the refractive index of about 1.7 to about 3. For example, each of the nanoparticles p may include a titanium oxide (TiO2) or a zirconium oxide (ZrO).

Hereinafter, a method of manufacturing the organic light emitting device according to embodiments of the inventive concept will be described.

FIGS. 4 to 12 are cross-sectional views for explaining an example of the method of manufacturing the organic light emitting device according to embodiments of the inventive concept. FIG. 8B is a cross-sectional view for explaining a modified example of the method of manufacturing the organic light emitting device according to embodiments of the inventive concept.

Figure 4:
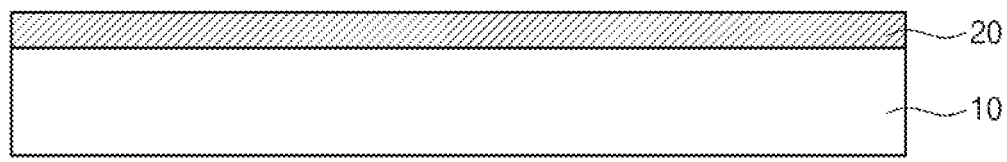
FIGS. 4 to 12 are cross-sectional views for explaining an example of a method of manufacturing the organic light emitting device according to embodiments of the inventive concept.

Referring to FIG. 4, the lower electrode 20 may be formed on the lower substrate 10. The lower electrode 20 may be formed through a thin film deposition process. The thin film deposition process may be a process for forming a transparent conductive layer such as an ITO on the lower substrate 10. Although not shown, a thin film transistor (TFT) may be disposed between the lower substrate 10 and the lower electrode 20.

Figure 5:
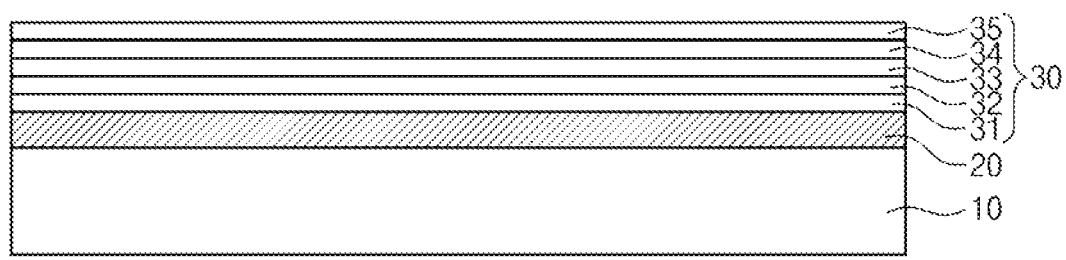

Referring to FIG. 5, the organic layer 30 may be formed on the lower electrode 20. The organic layer 30 may include the first charge injecting layer 31, the first charge transporting layer 32, the organic light emitting layer 33, the second charge transporting layer 34, and the second charge injecting layer 35, which are sequentially laminated on the lower electrode 20. Each of the first charge injecting layer 31, the first charge transporting layer 32, the organic light emitting layer 33, the second charge transporting layer 34, and the second charge injecting layer 35 may be formed through an organic thin film deposition process.

The light extraction layer 50 may be formed on the upper substrate 60. The light extraction layer 50 may include the adhesion layer 51, the binder layer 52, and the nanoparticles p. Hereinafter, a method of forming the light extraction layer 50 will be explained with reference to FIGS. 6 and 10.

Figure 6:

Referring to FIG. 6, a self-assembled monolayer 102 may be formed on a first sacrificial substrate 101. The first sacrificial substrate 101 may include a silicon substrate having the center line average roughness (Ra) that is equal to or less than about 1 nm. The first sacrificial substrate 101 may be formed to have the center line average roughness (Ra) that is equal to or less than about 1 nm through a chemical-mechanical polishing (CMP). The self-assembled monolayer 102 may be formed in such a manner that a hydroxyl group (OH—) is formed on the first sacrificial substrate 101 and then the hydroxyl group (OH—) and the self-assembly mono-material are condensation-reacted. The hydroxyl group (OH—) may be formed on a surface of the first sacrificial substrate 101 by UV-ozone treatment and oxygen plasma treatment. The self-assembly mono-material may be formed to have the same surface roughness as the first sacrificial substrate 101 during the contraction-reaction process. For example, the self-assembled monolayer 102 may have the center line average roughness (Ra) that is equal to or less than about 1 nm. The self-assembly mono-material may include trichloro(1H, 1H, 2H, 2H-heptadecafluorodecyl)silane.

Figure 7:
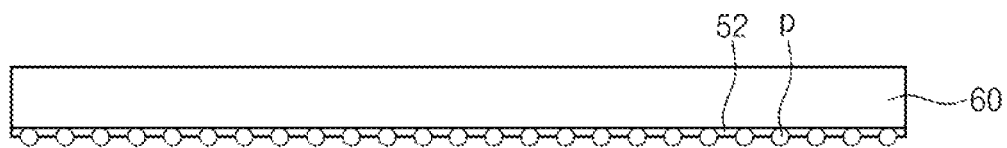

Referring to FIG. 7, the binder layer 52 may be formed on one surface of the upper substrate 60. The binder layer 52 may be formed by applying a binder onto the upper substrate 60. For example, the application process may include a spin coating process or a spray coating process. The binder may include the nanoparticles p, and the nanoparticles p may be added at about 0.1 wt % to about 50 wt % on the basis of the binder. Here, the nanoparticles p may protrude from a surface of the binder layer 52 according to an application thickness of the binder. For example, the binder may have a mean application thickness that is less than the diameter of each of the nanoparticles p. Accordingly, the nanoparticles p may be arranged parallel to the surface of the binder layer 52, and an uneven structure may be formed on the surface of the binder layer 52 by the nanoparticles p. The binder may include acrylate or urethane. The each of the nanoparticles p may include a titanium oxide (TiO2) or a zirconium oxide (ZrO). Each of the nanoparticles p may have the diameter d of about 10 nm to about 600 nm. Although not shown, a surface treatment process may be further performed on the upper substrate 60 before the binder layer 52 is formed on the upper substrate 60. For example, surface treatment by using an acrylate or surface treatment by using a urethane may be performed on the upper substrate 60. The surface treatment of the upper substrate 60 may be performed to enhance bonding between the upper substrate 60 and the binder.

Figure 8A:
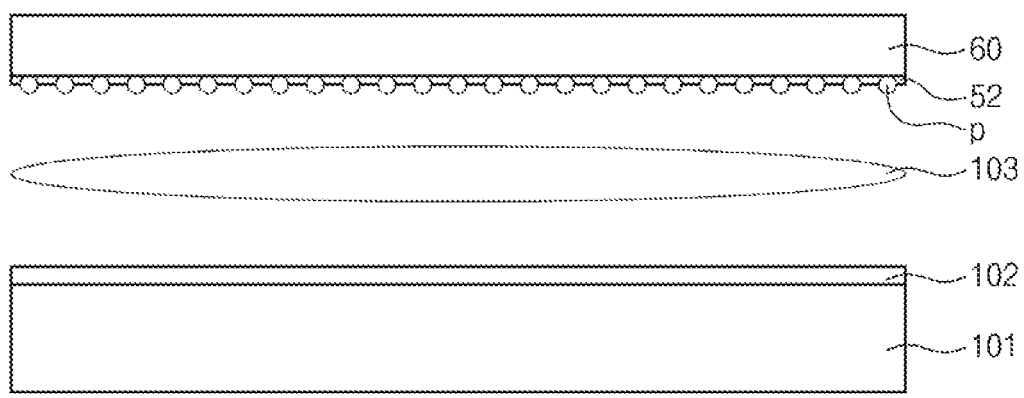
FIG. 8B is a cross-sectional view for explaining a modified example of the method of manufacturing the organic light emitting device according to embodiments of the inventive concept.

Referring to FIG. 8A, an adhesive 103 may be provided between the self-assembled monolayer 102 and the upper substrate 60. For example, the first sacrificial substrate 101 and the upper substrate 60 may be disposed so that the self-assembled monolayer 102 faces the binder layer 52. Then, the adhesive 103 may be applied onto the self-assembled monolayer 102 or the binder layer 52. The adhesive 103 may be in a liquid state. The adhesive 103 may include poly dimethyl siloxanes having a plurality of different kinds of terminal functional groups. For example, the adhesive 103 may include poly dimethyl siloxanes having an acrylate terminal functional group, an epoxy terminal functional group, or a carbinol terminal functional group. On the other hand, the adhesive 103 may include poly dimethyl siloxanes having an (epoxypropoxy)propyl of an epoxy terminal functional group, (epoxypropoxylpropyl)(dimethoxy)silyl, or a mono(2,3-epoxy)propyl ether terminal group. The adhesive 103 may be applied onto the self-assembled monolayer 102. The adhesive 103 may form a liquid bridge between the binder layer 52 formed on one surface of the upper substrate 60 and the self-assembled monolayer 102. The self-assembled monolayer 102 and the binder layer 52 may be bonded to each other by the adhesive 103.

Figure 8B:
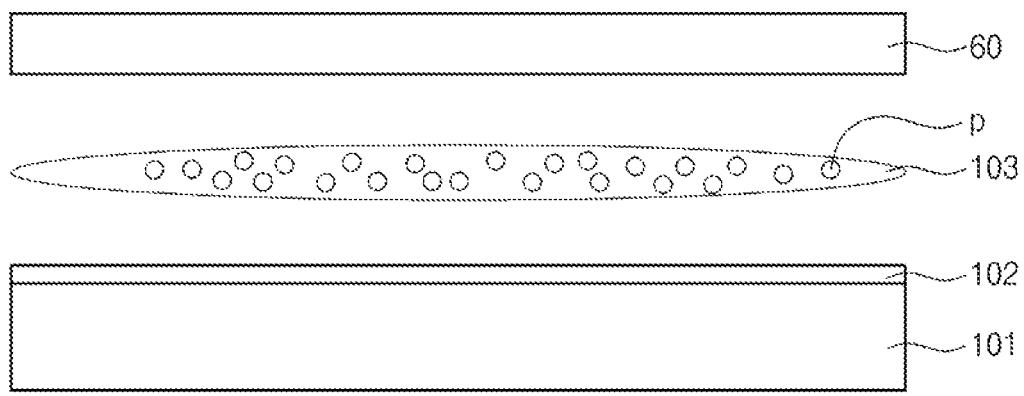

According to another embodiment, the process of forming the binder layer 52 that is described in FIG. 7 may be omitted. Referring to FIG. 8B, the adhesive 103 may be provided between the self-assembled monolayer 102 and the upper substrate 60. For example, the upper substrate 60 may be disposed on the self-assembled monolayer 102. Then, the adhesive 103 may be applied onto the self-assembled monolayer 102 or the upper substrate 60. The adhesive 103 may include the nanoparticles p. Here, the nanoparticles p may be added at about 0.1 wt % to about 50 wt % on the basis of the adhesive 103. The adhesive 103 may be in a liquid state. The adhesion layer 103 may include poly dimethyl siloxanes having a plurality of different kinds of terminal functional groups. Each of the nanoparticles p may include a titanium oxide (TiO2) or a zirconium oxide (ZrO). Each of the nanoparticles p may have the diameter d of about 10 nm to about 600 nm. The adhesive 103 may form a liquid bridge between the upper substrate 60 and the self-assembled monolayer 102. The self-assembled monolayer 102 and the upper substrate 60 may be bonded to each other by the adhesive 103. Hereinafter, although an output of FIG. 8A will be described as a reference for convenience of description, a method of manufacturing an organic light emitting device that will be described later may be applied to an output of FIG. 8B.

Figure 9:
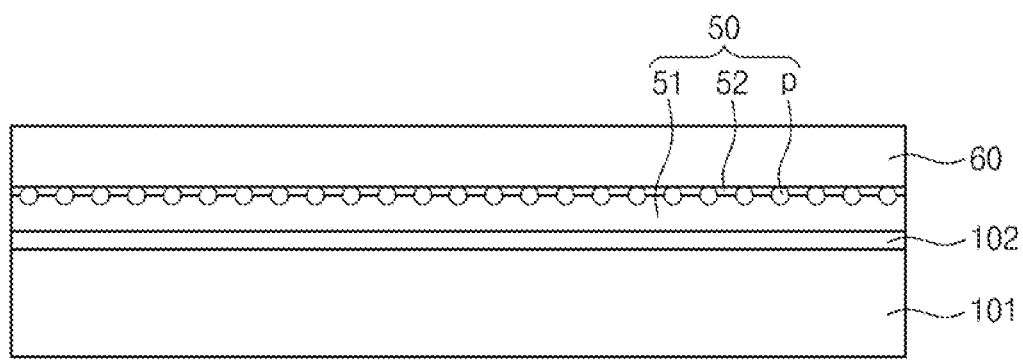

Referring to FIG. 9, the adhesion layer 51 may be formed between the self-assembled monolayer 102 and the upper substrate 60. The first sacrificial layer 101 and the upper substrate 60 may be coupled to each other by the adhesion layer 51. The adhesion layer 51 may be formed by acrylate reaction of the adhesive 103 and the binder layer 52. The acrylate reaction may be induced by ultraviolet rays. In addition, the adhesion layer 51 may be bonded to the binder layer 52 by the acrylate reaction. Meanwhile, when the binder layer 52 is not formed on the upper substrate 60, the adhesion layer 51 may be bonded to one surface, which is acrylate-processed, of the upper substrate 60 by the acrylate reaction.

Figure 10:
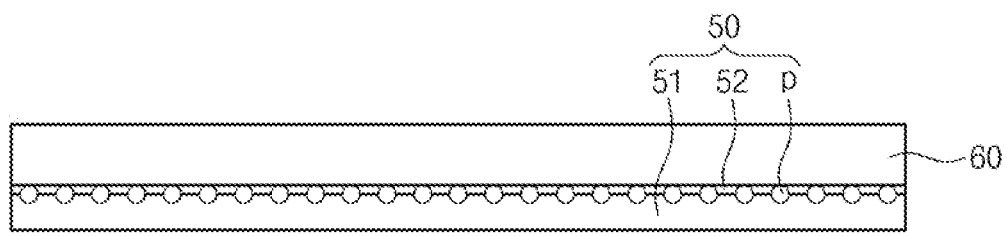

Referring to FIG. 10, the self-assembled monolayer 102 and the first sacrificial substrate 101 may be removed. Through this, one surface of the adhesion layer 51 may be exposed. The self-assembled monolayer 102 and the first sacrificial substrate 101 may be separated from the adhesion layer 51 by using a physical force. Here, the exposed one surface of the adhesion layer 51 may be formed to have the same surface roughness as self-assembled monolayer 102. For example, the exposed adhesion layer 51 may have the center line average roughness (Ra) that is equal to or less than about 1 nm.

An upper electrode that will be described later may be formed on the adhesion layer 51. According to an embodiment, an upper electrode 40 may be formed by a transferring method. This will be described below in detail with reference to FIGS. 11 and 12.

Figure 11:
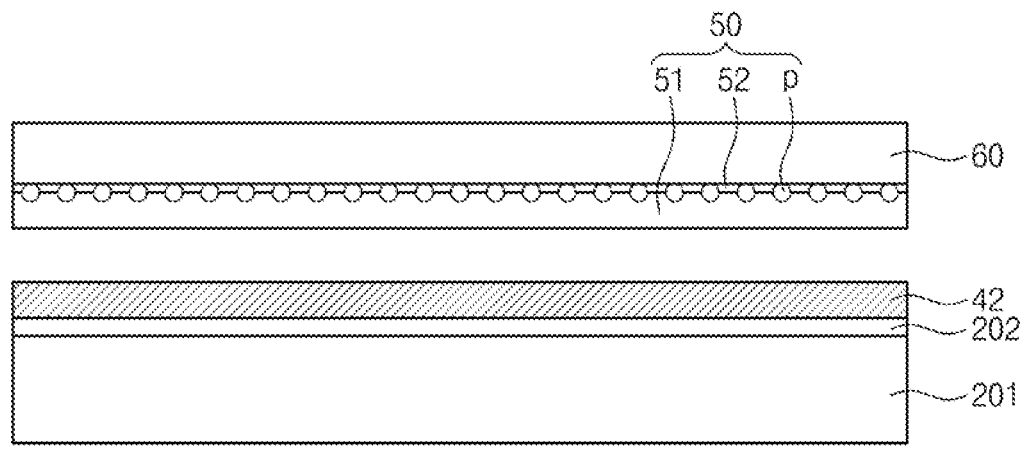

Referring to FIG. 11, a catalyst layer 202 may be formed on the second sacrificial substrate 201. The second sacrificial substrate 201 may include a silicon substrate. The catalyst layer 202 may include nickel catalyst. A preliminary upper electrode 42 may be formed on the catalyst layer 202. For example, when the preliminary upper electrode 42 includes graphene, the preliminary upper electrode 42 may be formed by through a chemical vapor deposition method. Then, the preliminary upper electrode 42 may be bonded to the adhesion layer 51 to form the upper electrode. For example, the second sacrificial layer 201 and the upper substrate 60 may be pressed to bond the preliminary upper electrode 42 to the adhesion layer 51. Here, the upper electrode 40 may conformally contact the adhesion layer 51. The conformal contact represents that the adhesion layer 51 and the preliminary upper electrode 52 are bonded without a gap therebetween. An interface, which is formed through the conformal contact, between the upper electrode 40 and the adhesion layer 51 may have the same surface roughness as the adhesion layer 51. The low surface roughness of the upper electrode 40 may decrease a reflectance and surface resistance of the upper electrode 40 and increase a transmittance thereof.

Figure 12:
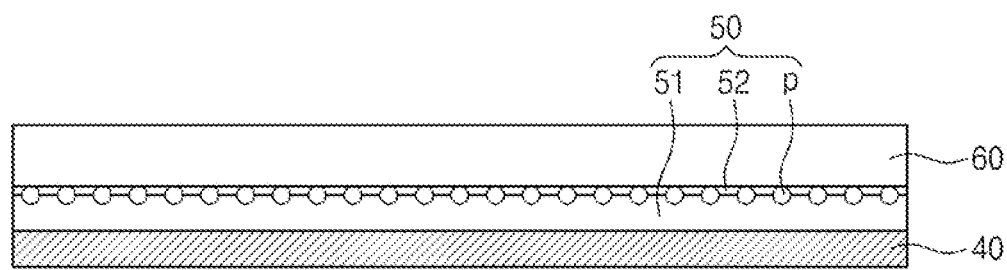

Referring to FIG. 12, the catalyst layer 202 and the second sacrificial substrate 201 may be removed to expose the upper electrode 40. The catalyst layer 202 may be removed by an etchant. The etchant may include ferric chloride (FeCl3). The second sacrificial substrate 201 may be separated from the upper electrode 40. The upper electrode 40 may be cleaned. A cleaning solution for the upper electrode 40 may include hydrochloric acid and deionized water.

Referring to FIG. 1 again, the upper substrate 60 and the lower substrate 10 may be coupled so that the upper electrode 40 contacts the organic layer 30. For example, the upper substrate 60 and the lower substrate 10 may be pressed to compress the upper electrode 40 and the organic layer 30. Here, the upper electrode 40 may conformally contact the organic layer 30. Although not shown, the upper substrate 60 may be compressed to the lower substrate 10 by an elastic layer (not shown). Then, the elastic layer (now shown) may be removed.

Figure 13:
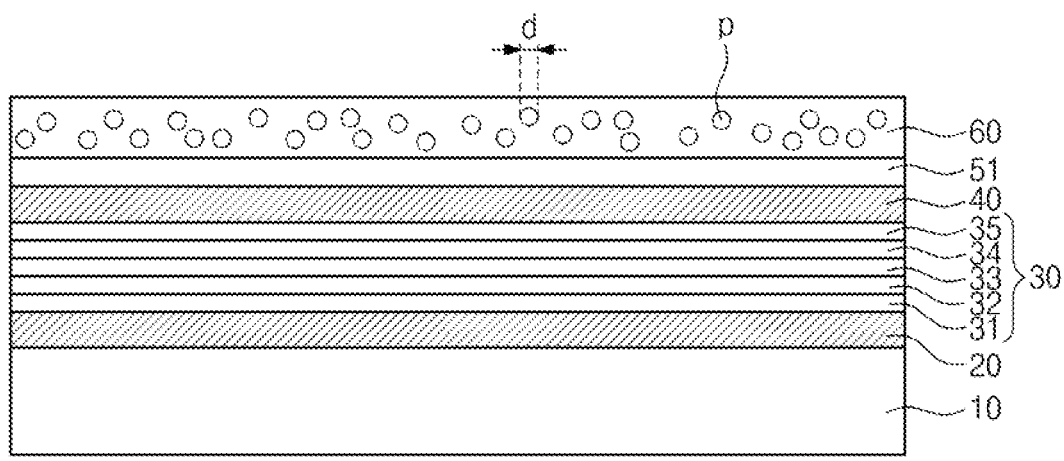
FIG. 13 is a cross-sectional view for explaining another example of the organic light emitting device according to embodiments of the inventive concept.

FIG. 13 is a cross-sectional view for explaining another example of the organic light emitting device according to embodiments of the inventive concept. Hereinafter, the duplicated descriptions, which have been described already, will be omitted.

Referring to FIG. 13, a lower substrate 10 may be provided. The lower substrate 10 may include a transparent substrate such as glass.

A lower electrode 20 may be disposed on the lower substrate 10. The lower electrode 20 may include an indium tin oxide (ITO), aluminum, or graphene.

An organic layer 30 may be disposed on the lower electrode 20. A structure and material of the organic layer 30 may be the same as those disclosed in the first embodiment. That is, the organic layer 30 may include a first charge injecting layer 31, a first charge transporting layer 32, an organic light emitting layer 33, a second charge transporting layer 34, and a second charge injecting layer 35, which are sequentially laminated.

An upper electrode 40 may be disposed on the organic layer 30. The upper electrode 40 may include graphene, a carbon nano tube (CNT), an Ag nano wire, or PEDOT:PSS. The upper electrode 40 may have a center line average roughness (Ra) that is equal to or less than about 1 nm. The upper electrode 40 having the center line average roughness (Ra) that is equal to or less than about 1 nm may decrease a reflectance of the organic light emitting device, increase a transmittance thereof, and reduce surface resistance characteristics thereof.

An adhesion layer 51 may be disposed on the upper electrode 40. The adhesion layer 51 may directly contact the upper electrode 40. The adhesion layer 51 may be a semi-solid having viscoelasticity and deformed by an external force. The adhesion layer 51 may include poly dimethyl siloxanes having a plurality of different kinds of terminal functional groups. A contact surface between the adhesion layer 51 and the upper electrode 40 may have the center line average roughness (Ra) that is equal to or less than about 1 nm.

An upper substrate 60 may be disposed on the adhesion layer 51. The upper substrate 60 may include a polyethylene terephthalate (PET) film, a poly ethylene naphthalate (PEN) film, or polyimide (PI) film. The upper substrate 60 may be a display substrate to which light emitted from the organic layer 30 is released.

Nanoparticles p may be disposed in the upper substrate 60. Here, the nanoparticles p may be provided in plurality, and arrangement of the nanoparticles p may have irregularity. Each of the nanoparticles p may be formed in a size capable of obtaining a light scattering effect. For example, each of the nanoparticles p may have a diameter d of about 10 nm to about 600 nm. Although each of the nanoparticles p has a globular shape in FIG. 13, it may have an oval or amorphous shape. Each of the nanoparticles p may include a material having a high refractive index and desirably have the refractive index of about 1.7 to about 3. For example, the each of the nanoparticles p may include a titanium oxide (TiO2) or a zirconium oxide (ZrO). The nanoparticles p may scatter the light emitted from the organic layer 30 to increase a light extraction efficiency of the organic light emitting device.

Hereinafter, a method of manufacturing the organic light emitting device according to embodiments will be described.

FIGS. 14 to 20 are cross-sectional views for explaining another example of the method of manufacturing the organic light emitting device according to embodiments of the inventive concept.

Figure 14:
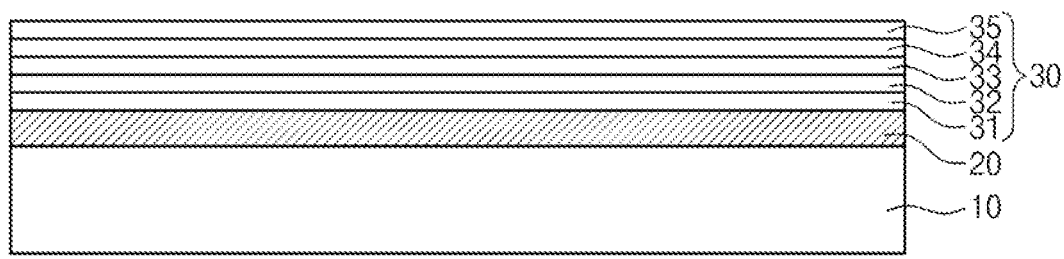
FIGS. 14 to 20 are cross-sectional views for explaining another example of the method of manufacturing the organic light emitting device according to embodiments of the inventive concept.

Referring to FIG. 14, the lower electrode 20 and the organic layer 30 may be formed on the lower substrate 10. A method of forming the lower electrode 20 and the organic layer 30 on the lower substrate 10 and a constitution of the lower electrode 20 and the organic layer 30 may be the same as those described with reference to FIGS. 4 and 5. That is, the lower electrode 20 may be formed on the lower substrate 10 through a thin film deposition process, and then the first charge injecting layer 31, the first charge transporting layer 32, the organic light emitting layer 33, the second charge transporting layer 34, and the second charge injecting layer 35 may be sequentially laminated on the lower electrode 20 through the organic thin film deposition process.

Figure 15:
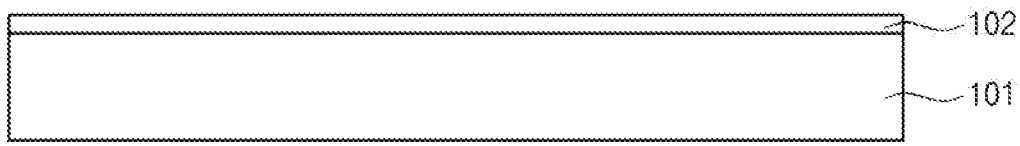

Referring to FIG. 15, the self-assembled monolayer 102 may be formed on the first sacrificial substrate 101. The self-assembled monolayer 102 may be formed in the same method as that described with reference to FIG. 6. That is, the self-assembled monolayer 102 may be formed in such a manner that a hydroxyl group (OH—) is formed on the first sacrificial substrate 101 and then the hydroxyl group (OH—) and the self-assembly mono-material are condensation-reacted. The first sacrificial substrate 101 may include a silicon substrate having the center line average roughness (Ra) that is equal to or less than about 1 nm. The self-assembly mono-material may be formed to have the same surface roughness as the first sacrificial substrate 101 during the contraction-reaction process. For example, the self-assembled monolayer 102 may have the center line average roughness (Ra) that is equal to or less than about 1 nm.

Figure 16:
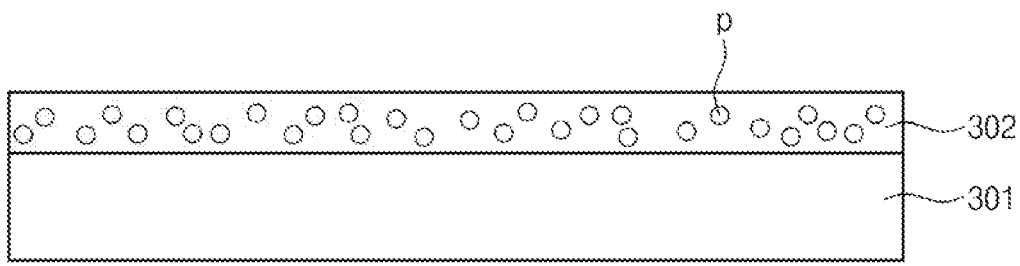

Referring to FIG. 16, a precursor solution 302 may be applied onto a third sacrificial substrate 301. A process of applying the precursor solution 302 may include a spin coating process or a bar coating process. The precursor solution 302 may include poly(amic acid). The precursor solution 302 may include the nanoparticles p, and the nanoparticles p may be added at about 0.1 wt % to about 50 wt % on the basis of the precursor solution 302. Each of the nanoparticles p may include a titanium oxide (TiO2) or a zirconium oxide (ZrO). Each of the nanoparticles p may have the diameter d of about 10 nm to about 600 nm.

Figure 17:
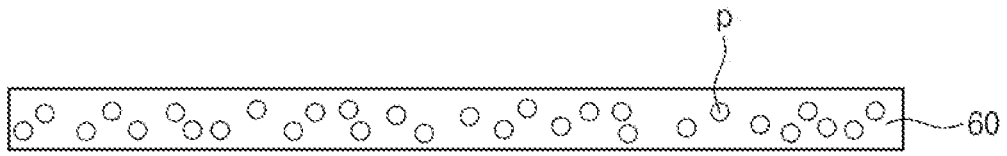

Referring to FIG. 17, the precursor solution may be cured, and then the third sacrificial substrate 301 may be removed to form the upper electrode 60. For example, in case that the precursor solution includes poly(amic acid), the precursor solution may be heat-treated to form the polyimide (PI) substrate. Then, the third sacrificial substrate 301 is removed from the cured precursor solution to form the upper substrate 60 including the nanoparticles p. Although not shown, a surface treatment process may be further performed on the upper substrate 60. For example, acrylate treatment or urethane treatment may be performed on the upper substrate 60. The surface treatment of the upper substrate 60 may be performed to enhance bonding between the adhesive 103 and the upper substrate 60 in the process of forming the adhesion layer 51 that will be described later.

Figure 18:
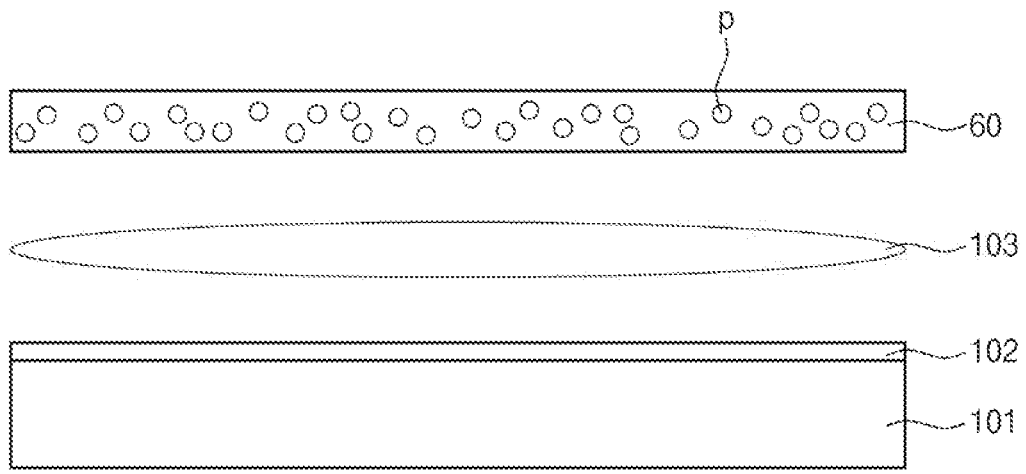

Referring to FIG. 18, the adhesive 103 may be provided between the self-assembled monolayer 102 and the upper substrate 60. For example, the adhesive 103 may be applied onto the self-assembled monolayer 102. The adhesive 103 may form a liquid bridge between the upper substrate 60 and the self-assembled monolayer 102. The adhesive 103 may bond the self-assembled monolayer 102 to the upper substrate 60. The adhesive 103 may be in a liquid state. The adhesion layer 103 may include poly dimethyl siloxanes having a plurality of different kinds of terminal functional groups. For example, the adhesion layer 103 may include poly dimethyl siloxanes having an acrylate terminal functional group, an epoxy terminal functional group, or a carbinol terminal functional group.

Figure 19:
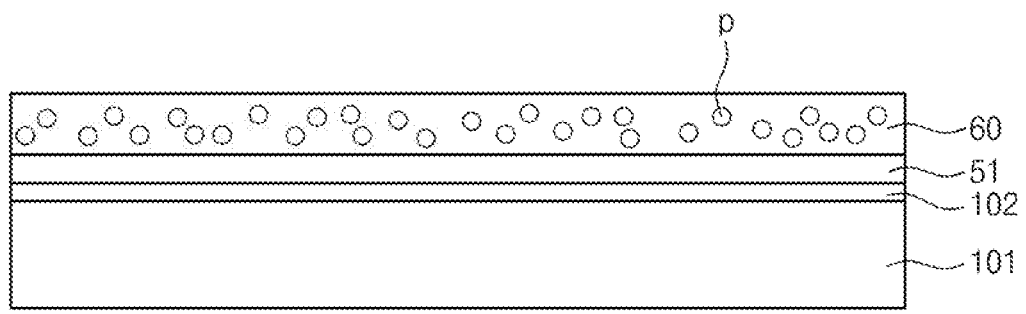

Referring to FIG. 19, the adhesion layer 51 may be formed between the self-assembled monolayer 102 and the upper substrate 60. The adhesion layer 51 may be formed by acrylate reaction between one surface, which is acrylate-processed, of the upper substrate 60 and the adhesive 103. The acrylate reaction may be induced by ultraviolet rays. The adhesive 103 may have a plurality of acrylate terminal functional group. In addition, the adhesion layer 51 may be strongly bonded to the upper substrate 60 by the acrylate reaction.

Figure 20:
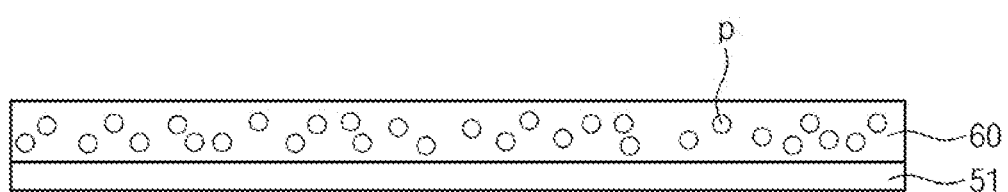

Referring to FIG. 20, the self-assembled monolayer 102 and the first sacrificial substrate 101 may be removed to expose the adhesion layer 51. The self-assembled monolayer 102 and the first sacrificial substrate 101 may be separated from the adhesion layer 51 by using a physical force. Here, the exposed one surface of the adhesion layer 51 may be formed to have the same surface roughness as self-assembled monolayer 102. For example, the exposed adhesion layer 51 may have the center line average roughness (Ra) that is equal to or less than about 1 nm.

Referring to FIG. 13 again, the upper electrode 40 may be formed on the adhesion layer 51, and then the upper electrode 40 and the organic layer 30 may be bonded to each other. A method of forming the upper electrode 40 and a method of bonding the upper electrode 40 to the organic layer 30 may be the same as those described with reference to FIGS. 11 to 12. That is, the upper electrode 40 may be formed by the transferring method. For example, the preliminary upper electrode 42 deposited on the second sacrificial layer 201 may be bonded onto the adhesion layer 51, and then the second sacrificial substrate 201 is removed to form the upper electrode 40. Then, the upper electrode 40, the adhesion layer 51, and the upper electrode 60 may be transferred onto the organic layer 30. For example, the upper substrate 60 and the lower substrate 10 may be pressed to compress the upper electrode 40 and the organic layer 30.

A conventional method of forming the transparent electrode requires strong energy, which may cause damage to the organic layer. In the method of manufacturing the organic light emitting device according to embodiments of the inventive concept, the upper electrode and the light extraction layer may be formed on the organic layer through the dry transferring method. Accordingly, the transparent upper electrode and the light extraction layer may be formed without the damage to the organic layer. Also, the light extraction layer may be formed within the process of forming the upper electrode, and thus the manufacturing process may be simplified.

The organic light emitting device manufactured according to embodiments of the inventive concept includes the light extraction layer in which the nanoparticles are arranged. The nanoparticles in the light extraction layer may scatter the light emitted from the organic layer, and thus the light extraction efficiency of the organic light emitting device may increase. Also, the interface between the upper electrode and the light extraction layer may be formed to have the sufficiently low surface roughness. Thus, the reflectance and surface resistance of the organic light emitting device may decrease and the transmittance thereof may increase.

According to the embodiments of the inventive concept, the method of manufacturing the organic light emitting device may form the transparent upper electrode and the light extraction layer without damage to the organic layer by forming the upper electrode and the light extraction layer through the dry transferring method. Also, the light extraction layer may be formed within the process of forming the upper electrode, and thus the manufacturing process may be simplified.

The organic light emitting device manufactured according to the embodiments of the inventive concept may increase the light extraction efficiency due to the nanoparticles of the light extraction layer. Also, the interface between the upper electrode and the light extraction layer has the sufficiently low surface roughness. Thus, the reflectance and surface resistance of the organic light emitting device may decrease, and the transmittance thereof may increase.

The description of the present disclosure is intended to be illustrative, and those with ordinary skill in the technical field of the present invention will be understood that the present disclosure can be carried out in other specific forms without changing the technical idea or essential features. Thus, the above-disclosed embodiments are to be considered illustrative and not restrictive.

What is claimed is:

1. A method of manufacturing an organic light emitting device, the method comprising:
    forming a lower electrode on a lower substrate;
    forming an organic layer on the lower electrode;
    forming a light extraction layer comprising an adhesion layer and nanoparticles on an upper substrate;
    forming an upper electrode on the light extraction layer; and
    coupling the lower substrate to the upper substrate so that the upper electrode contacts the organic layer,
    wherein the forming of the light extraction layer comprises:
    providing an adhesive between a first sacrificial substrate and the upper substrate;
    curing the adhesive to form the adhesion layer, wherein the first sacrificial substrate and the upper substrate are coupled to each other by the adhesion layer; and
    removing the first sacrificial substrate to expose the adhesion layer.

2. The method of claim 1, wherein the adhesive comprises the nanoparticles, and
    the nanoparticles are added at about 0.1 wt % to about 50 wt % on the basis of a weight of the adhesive.

3. The method of claim 1, further comprising forming a binder on the upper substrate before the adhesive is provided between the first sacrificial substrate and the upper substrate,
    wherein the adhesion layer covers the binder.

4. The method of claim 3, wherein the binder comprises the nanoparticles, and
    the nanoparticles are added at about 0.1 wt % to about 50 wt % on the basis of a weight of the binder.

5. The method of claim 3, wherein the binder comprises acrylate or urethane.

6. The method of claim 1, wherein the adhesive comprises a polydimethylsiloxane having an acrylate terminal functional group, an epoxy terminal functional group, or a carbinol terminal functional group.

7. The method of claim 1, wherein each of the nanoparticles comprises a titanium oxide ($TiO_2$) or a zirconium oxide (ZrO).

8. The method of claim 1, wherein each of the nanoparticles has a diameter of about 10 nm to about 600 nm.

9. The method of claim 1, wherein each of the nanoparticles has a reflective index of about 1.7 to about 3.0.

10. The method of claim 1, wherein the forming of the upper electrode comprises:
    forming a catalyst layer on a second sacrificial substrate;
    forming a preliminary upper electrode on the catalyst layer; and
    transferring the preliminary upper electrode onto the light extraction layer.

11. The method of claim 1, further comprising forming a self-assembled monolayer (SAM) on the first sacrificial substrate before the adhesive is provided between the first sacrificial substrate and the upper substrate.

12. The method of claim 11, wherein the self-assembled monolayer has a center line average roughness (Ra) that is equal to or less than about 1 nm.

13. The method of claim 11, wherein the self-assembled monolayer comprises trichloro-alkylsilane.

14. The method of claim 1, wherein an interface between the light extraction layer and the upper electrode has a center line average roughness (Ra) that is equal to or less than about 1 nm.

15. A method of manufacturing an organic light emitting device, the method comprising:
    forming a lower electrode on a lower substrate;
    forming an organic layer on the lower electrode;
    forming an upper substrate comprising nanoparticles;
    forming an adhesion layer on the upper substrate;
    forming an upper electrode on the adhesion layer; and
    coupling the lower substrate to the upper substrate so that the upper electrode contacts the organic layer,
    wherein the forming of the adhesion layer comprises:
    providing an adhesive between a first sacrificial substrate and the upper substrate;
    curing the adhesive; and
    removing the first sacrificial substrate to expose the cured adhesive.

16. The method of claim 15, wherein the forming of the upper substrate comprises:

applying a precursor solution on a third sacrificial substrate;
curing the precursor solution; and
removing the third sacrificial substrate to form the upper substrate, and
wherein the precursor solution comprises the nanoparticles.

17. The method of claim 16, wherein the precursor solution comprises poly(amic acid).

18. The method of claim 16, wherein each of the nanoparticles comprises a titanium oxide ($TiO_2$) or a zirconium oxide ($ZrO$).

* * * * *